US012646684B2

(12) United States Patent      (10) Patent No.: US 12,646,684 B2

Tomura et al.      (45) Date of Patent: Jun. 2, 2026

(54) ETCHING METHOD AND ETCHING APPARATUS

(71) Applicant: Tokyo Electron Limited, Tokyo (JP)

(72) Inventors: Maju Tomura, Miyagi (JP); Ryutaro Suda, Miyagi (JP); Nobuyuki Fukui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 524 days.

(21) Appl. No.: 18/023,890

(22) PCT Filed: Aug. 27, 2021

(86) PCT No.: PCT/JP2021/031596

§ 371 (c)(1),
(2) Date: Feb. 28, 2023

(87) PCT Pub. No.: WO2022/050198

PCT Pub. Date: Mar. 10, 2022

(65) Prior Publication Data

US 2024/0038494 A1     Feb. 1, 2024

(30) Foreign Application Priority Data

Sep. 1, 2020    (JP) ................................ 2020-146576

(51) Int. Cl.
*H01J 37/32*      (2006.01)
*H10P 50/24*      (2026.01)
*H10P 50/28*      (2026.01)

(52) U.S. Cl.
CPC .. *H01J 37/32165* (2013.01); *H01J 37/32935* (2013.01); *H10P 50/242* (2026.01); *H10P 50/283* (2026.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 7,144,521 B2* | 12/2006 | Rusu | ................ | H01J 37/32082 257/E21.252 |
| 2012/0064726 A1* | 3/2012 | Nozawa | ............ | H01L 21/76224 156/345.41 |
| 2020/0251345 A1* | 8/2020 | Yin | ................... | H01L 21/31116 |

FOREIGN PATENT DOCUMENTS

| | | |
|---|---|---|
| JP | H04-027119 A | 1/1992 |
| JP | H06-122983 A | 5/1994 |

(Continued)

OTHER PUBLICATIONS

International Search Report (PCT/ISA/210) issued on Oct. 19, 2021, by the Japanese Patent Office as the International Searching Authority for International Application No. PCT/JP2021/031596. (4 pages).

(Continued)

*Primary Examiner* — Stephanie P Duclair

(74) *Attorney, Agent, or Firm* — XSENSUS LLP

(57) ABSTRACT

An etching method includes: steps a), b), c), and d). Step a) provides a substrate having an underlying layer and an etching target film formed on the underlying layer, on a stage. Step b) generates plasma from a processing gas. Step c) supplies a bias power having a first frequency to the stage to etch the etching target film, thereby forming a recess. Step d) changes a frequency of the bias power to a second frequency different from the first frequency according to an aspect ratio of the recess after step c), to further etch the etching target film. After a generation of the plasma, the etching target film is continuously etched during a time period until the underlying layer is exposed.

15 Claims, 9 Drawing Sheets

(56)     References Cited

FOREIGN PATENT DOCUMENTS

| | | | |
|---|---|---|---|
| JP | H06-326176 | A | 11/1994 |
| JP | 2008-192906 | A | 8/2008 |
| JP | 2012-142495 | A | 7/2012 |
| JP | 2014-017438 | A | 1/2014 |
| TW | 201727693 | A | 8/2017 |

OTHER PUBLICATIONS

Written Opinion (PCT/ISA/237) issued on Oct. 19, 2021, by the Japanese Patent Office as the International Searching Authority for International Application No. PCT/JP2021/031596. (4 pages).

\* cited by examiner

ETCHING METHOD AND ETCHING APPARATUS

CROSS-REFERENCE TO RELATED APPLICATION

This application is a 371 National Phase Application of International Patent Application PCT/JP2021/031596, filed Aug. 27, 2021, which claims priority to Japanese Patent Application No. 2020-146576, filed Sep. 1, 2020, the entire contents of which are incorporated herein by reference and priority is claimed to each of the foregoing.

TECHNICAL FIELD

The present disclosure relates to an etching method and an etching apparatus.

BACKGROUND

Various methods have been proposed for forming a pattern having a high aspect ratio with a high accuracy. For example, there is a method, which supplies a radio frequency (RF) bias power for attracting ions to a stage on which a substrate is disposed, to accelerate an etching in a depth direction.

PRIOR ART DOCUMENT

Patent Document

Patent Document 1: JP 2008-192906 A

SUMMARY OF THE INVENTION

Problem to be Solved

The present disclosure provides a technique for improving a shape abnormality of a pattern being formed on a substrate by an etching.

Means to Solve the Problem

According to an aspect of the present disclosure, an etching method includes: a) providing a substrate on a stage, the substrate having an underlying layer and an etching target film on the underlying layer; b) generating plasma from a processing gas; c) supplying a bias power having a first frequency to the stage to etch the etching target film, thereby forming a recess; and d) changing a frequency of the bias power to a second frequency different from the first frequency according to an aspect ratio of the recess after c), to further etch the etching target film, wherein after a generation of the plasma, the etching target film is continuously etched during a time period until the underlying layer is exposed.

Effect of the Invention

According to the present disclosure, an effect is achieved in improving a shape abnormality of a pattern being formed on a substrate by an etching.

DETAILED DESCRIPTION TO EXECUTE THE INVENTION

Figure 1:
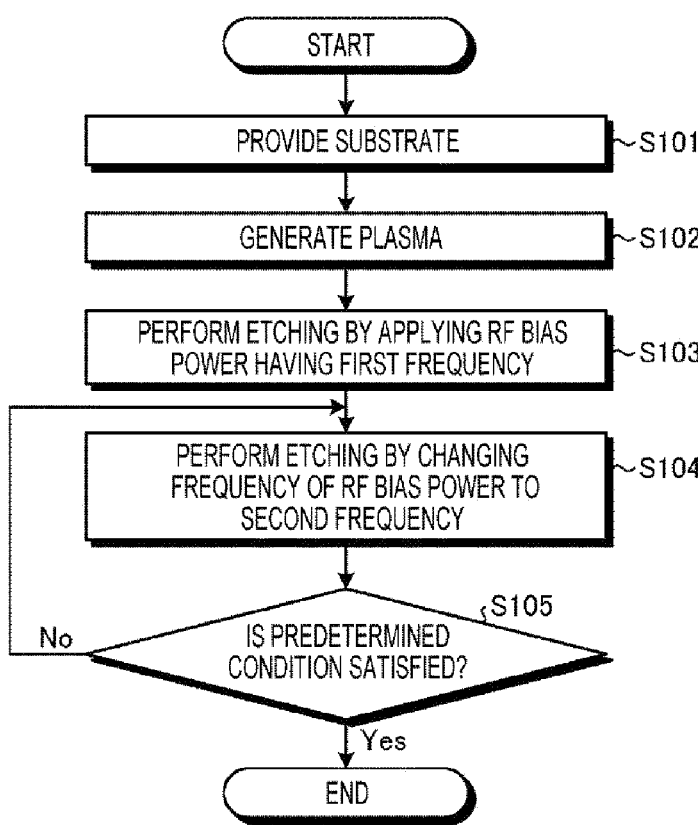
FIG. 1 is a flowchart illustrating an example of the flow of an etching method according to a first embodiment.

Hereinafter, embodiments of an etching method and an etching apparatus according to the present disclosure will be described in detail with reference to the accompanying drawings. The embodiments may be appropriately combined with each other within a scope that does not cause any inconsistency in process contents. In the respective drawings, similar or corresponding portions will be denoted by the same reference numerals.

In the description of each embodiment herein below, when describing a direction of a pattern being formed on a substrate, a direction substantially perpendicular to the surface of the substrate will be referred to as a thickness direction or a depth direction. A direction substantially parallel to the surface of the substrate will be referred to as a horizontal direction. When the substrate has a substantially disc shape, a direction parallel to the surface of the substrate and directed from the center of the disc toward the circumference thereof will also be referred to as a radial direction.

In the description herein below, a "pattern" refers to all shapes formed on a substrate. The pattern indicates all of a plurality of shapes formed on a substrate such as, for example, holes, trenches, and line-and-space. A "recess" refers to a portion, which is dented in the thickness direction of a substrate, in a pattern formed on the substrate. The recess has a "side wall" which is the inner peripheral surface of the dented shape, a "bottom" which is the bottom of the dented shape, and a "top" which is continuous with the side wall and is the surface of the substrate near the side wall. A space surrounded by the edge of the top of the recess will be referred to as an "opening." The term "opening" is also used to indicate the entire space surrounded by the bottom and the side wall of the recess or any position in the space. A horizontal dimension of the space formed by the recess will be referred to as an "opening dimension." A ratio of the depth of the recess (the dimension of the recess from the top to the bottom) to the opening dimension of the top (an opening end) of the recess is defined as an "aspect ratio."

It is known that shape abnormalities occur when an etching is performed to form patterns having a high aspect ratio. For example, a phenomenon called a bowing is known, in which the inner peripheral surface of a hole expands in the horizontal direction when the hole is formed in the depth direction. Further, a phenomenon called a taper is known, in which a hole gradually becomes narrower toward the bottom of the hole. In order to improve the shape abnormalities, it is desirable to provide not only a technique for accelerating an etching in the depth direction, but also a technique capable of controlling the shape of a recess formed by an etching during the etching.

Example of Flow of Etching Method according to First Embodiment

FIG. 1 is a flowchart illustrating an example of the flow of an etching method according to a second embodiment. The etching method according to the first embodiment changes a frequency of an RF bias power supplied to a stage on which a substrate is disposed, during the execution of etching, thereby controlling the shape of a recess formed in the substrate during the execution of etching.

First, a substrate is provided (step S101). For example, a substrate is provided, which has an underlying layer, an etching target film formed on the underlying layer, and a mask formed on the etching target film. The substrate is carried into a processing chamber provided therein with a stage, and is disposed on the stage.

Next, plasma is generated from a processing gas in the processing chamber (step S102). Next, an RF bias power having a first frequency is supplied to the stage on which the substrate is disposed, to etch the etching target film (step S103). In step S103, ions in the plasma are attracted to the etching target film so that the etching target film is etched. As a result of the etching of the etching target film, a pattern including a recess is formed on the substrate.

Next, the etching target film is further etched by changing the frequency of the RF bias power to a second frequency different from the first frequency, according to the aspect ratio of the recess being formed by the etching (step S104).

Thereafter, it is determined whether the formed pattern, for example, the recess satisfies a predetermined condition (step S105). When it is determined that the predetermined condition is not satisfied (step S105, No), the process continues by returning to step S104. Meanwhile, when it is determined that the predetermined condition is satisfied (step S105, Yes), the process is terminated.

The determination in step S105 is performed based on, for example, whether a cumulative process time of the etching in step S104 has reached a predetermined time.

Example of Pattern Formed in First Embodiment

Figure 2A:
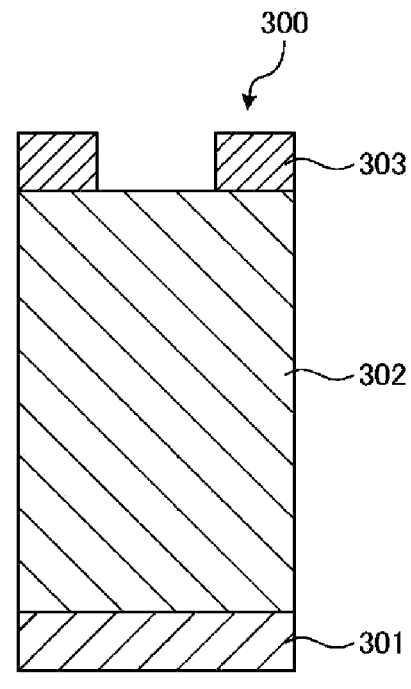
FIG. 2A is a view illustrating an embodiment of a substrate to which the etching method of the first embodiment is applied.

FIG. 2A is a view illustrating an example of a substrate to which the etching method of the first embodiment is applied.

A substrate 300 illustrated in FIG. 2A has an underlying layer 301, an etching target film 302, and a mask 303. In the etching method according to the first embodiment, first, the substrate 300 is disposed on the stage in step S101. Next, plasma is generated from a processing gas in step S102. Next, in step S103, an RF bias power having a first frequency is supplied to the stage to etch the etching target film 302. As for the first frequency, for example, a frequency of 0.1 MHz or more and 1 MHz or less or a frequency of 0.1 MHz or more and less than 1 MHz is used. Here, it is assumed that the first frequency is 400 kHz.

Figure 2B:
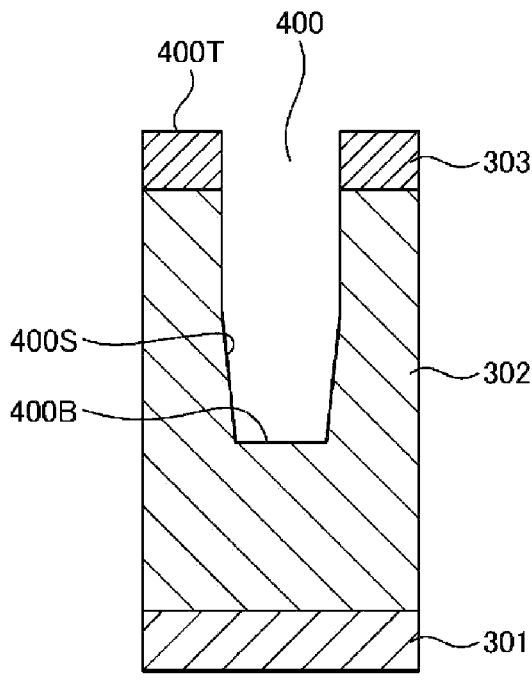
FIG. 2B is a view illustrating an embodiment of a recess formed in the substrate illustrated in FIG. 2A.

By the etching in step S103, a recess 400 is formed in the etching target film 302 and the mask 303 on the underlying layer 301, as illustrated in FIG. 2B. The recess 400 has a bottom 400B, a side wall 400S, and a top 400T. In the state of FIG. 2B, the bottom surface of the recess 400 (the surface of the bottom 400B) is positioned inside the etching target film 302. FIG. 2B is a view illustrating an example of the recess formed in the substrate 300 illustrated in FIG. 2A.

In FIG. 2B, the opening dimension (the width) of the recess 400 gradually decreases from the top 400T toward the bottom 400B. It is considered that the change in the opening dimension of the recess 400 is caused by the magnitude (400 kHz) of the frequency (the first frequency) of the RF bias power supplied to the stage. The present inventors have investigated the change in the opening dimension of the recess 400 being formed, by changing the frequency of the RF bias power.

Figure 3:
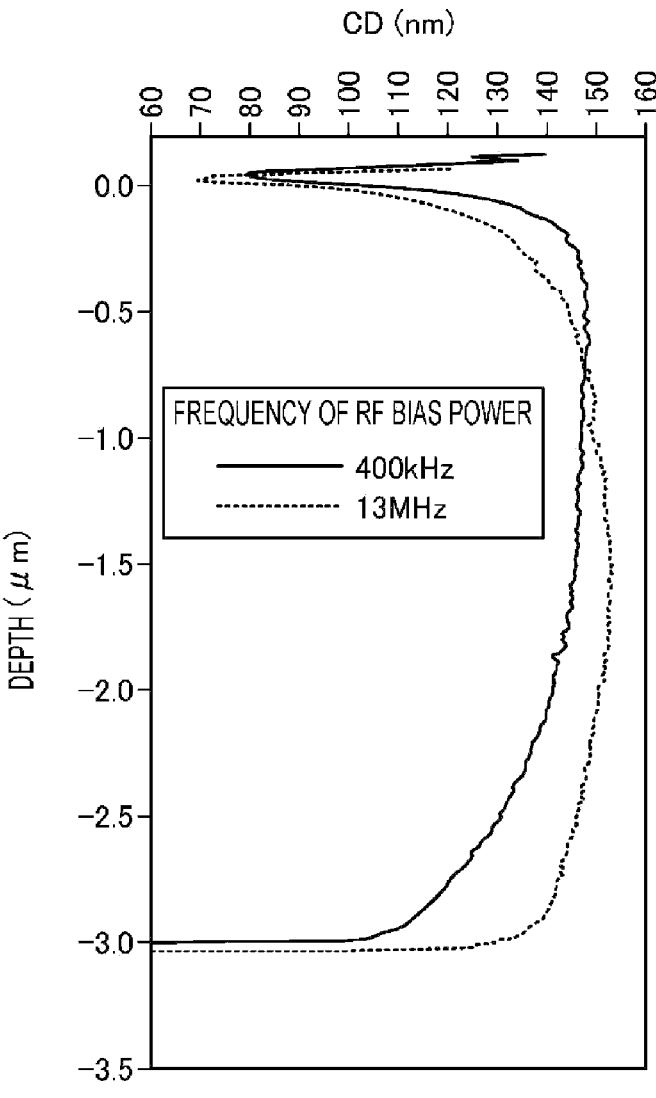
FIG. 3 is a view illustrating an example of a relationship between a frequency of an RF bias power and an opening dimension (a critical dimension (CD)) of a recess being formed.

FIG. 3 is a view illustrating an example of a relationship between the frequency of the RF bias power and the opening dimension (CD) of the formed recess 400. FIG. 3 plots the CD of the recess 400 formed when the substrate 300 is etched while changing the frequency of the RF bias power supplied to the stage, in association with the depth of the recess 400. The etching is performed until the recess 400 penetrates the etching target film 302, and the bottom surface of the recess 400 (the surface of the bottom 400B) reaches the underlying layer 301, that is, until the underlying layer 301 is exposed. As illustrated in FIG. 3, when the frequency of the RF bias power is 13 MHz, the CD of the recess 400 increases near the center of the recess 400 in the depth direction, so that the recess 400 has a bowing shape. Meanwhile, when the frequency of the RF bias power is 400 kHz, the CD of the recess 400 gradually decreases as the depth increases, so that the recess 400 has a tapered shape. From the result of FIG. 3, it may be understood that the shape of the recess 400 changes according to the frequency of the RF bias power supplied to the stage. That is, it may be understood that as the frequency of the RF bias power is low, the depth position at which the CD is the largest moves upward, so that the shape of the recess 400 becomes close to the tapered shape. Meanwhile, it may be understood that as the frequency of the RF bias power is high, the depth position at which the CD is the largest moves downward, so that the shape of the recess 400 becomes close to the bowing shape.

Figure 4:
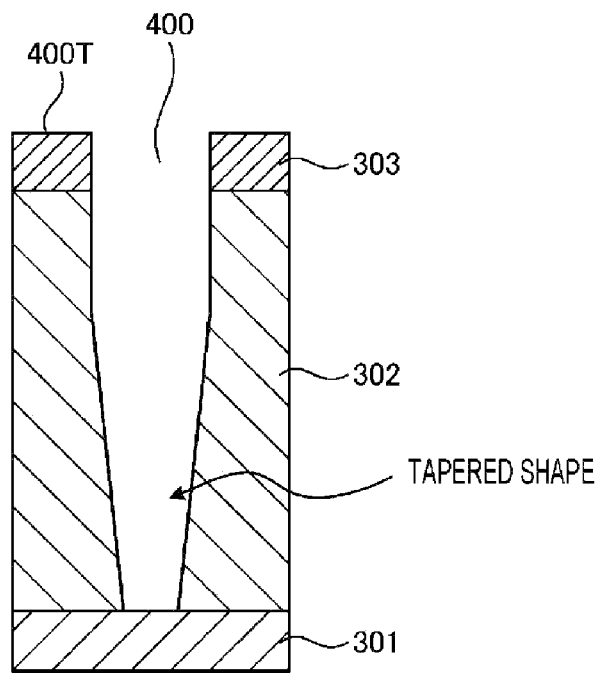
FIG. 4 is a view illustrating a case where the substrate illustrated in FIG. 2B is further etched in a state where the frequency of the RF bias power is maintained at a first frequency.

Here, it is assumed that the etching is progressed while maintaining the state of FIG. 2B (in other words, while maintaining the frequency of the RF bias power supplied to the stage at the first frequency (400 kHz)), and the bottom 400B of the recess 400 reaches the underlying layer 301. Then, as the depth increases, the opening dimension of the recess 400 decreases. In this case, as illustrated in FIG. 4, the recess 400 has the tapered shape. FIG. 4 is a view illustrating a case where the substrate 300 illustrated in FIG. 2B is further etched in a state where the frequency of the RF bias power is maintained at the first frequency.

In the etching method according to the first embodiment illustrated in FIG. 1, the shape of the recess 400 being formed in the substrate 300 is controlled by changing the frequency of the RF bias power supplied to the stage. That is, in the etching method according to the first embodiment, the etching target film 302 is further etched by changing the frequency of the RF bias power to the second frequency different from the first frequency according to the aspect ratio of the recess 400 (FIG. 1, step S104).

Specifically, the changing of the frequency of the RF bias power in step S104 is performed as follows. First, referring to data indicating the shape of the recess 400 formed when the etching target film 302 is etched until reaching the underlying layer 301 (hereinafter, referred to as "shape data") for each frequency of the RF bias power, the shape of the recess 400 that corresponds to the first frequency is specified. The shape data is, for example, data that indicates the relationship illustrated in FIG. 3 between the frequency of the RF bias power and the opening dimension (CD) of the formed recess 400 in the form of an arithmetic formula or a table. The shape data is obtained in advance by performing, for example, experiments or simulations. The shape data is stored, for example, in a storage unit of the etching apparatus. Then, when the shape of the recess 400 that corresponds to the first frequency is specified referring to the shape data, the second frequency is selected based on the specified shape of the recess 400. For example, when the specified shape of the recess 400 is the tapered shape, a frequency higher than the first frequency is selected as the second frequency. For example, when the specified shape of the recess 400 is the bowing shape, a frequency lower than the first frequency is selected as the second frequency. Here, referring to the shape data, the shape of the recess 400 that corresponds to the first frequency (400 kHz) is specified as the tapered shape, and a frequency higher than the first frequency is selected as the second frequency. The second frequency may be any frequency higher than the first frequency (400 kHz), and is selected from frequencies of, for example, 1 MHz or more and 13 MHz or less. Here, it is assumed that the second frequency is 13 MHz. Based on the shape of the recess 400 that has been specified by the shape data, an aspect ratio is obtained for a depth position at which the opening dimension (the width) of the recess 400 reaches the lower limit of a predetermined allowable range (hereinafter, the aspect ratio will be appropriately referred to as the "depth position aspect ratio"). Then, at a time point when the aspect ratio of the recess 400 after the etching in step S103 reaches the obtained depth position aspect ratio, the frequency of the RF bias power is changed to the selected second frequency (13 MHz). In other words, the process of step S103 is terminated, and the process of step S104 is performed, at a time point when the aspect ratio of the recess 400 after the etching in step S103 reaches the obtained depth position aspect ratio (an example of a time point when the opening dimension of the recess 400 is within the predetermined allowable range). The aspect ratio of the recess 400 is estimated using, for example, an elapsed time from the start of step S103 or a plasma state. The plasma state is, for example, the emission intensity. In a case of suppressing the shape abnormality such as the tapered shape in which the opening of the recess 400 narrows from top to bottom, the frequency of the RF bias power may be increased as the aspect ratio of the recess 400 increases, so that the the depth position at which the opening dimension is the largest may be moved downward.

Figure 5:
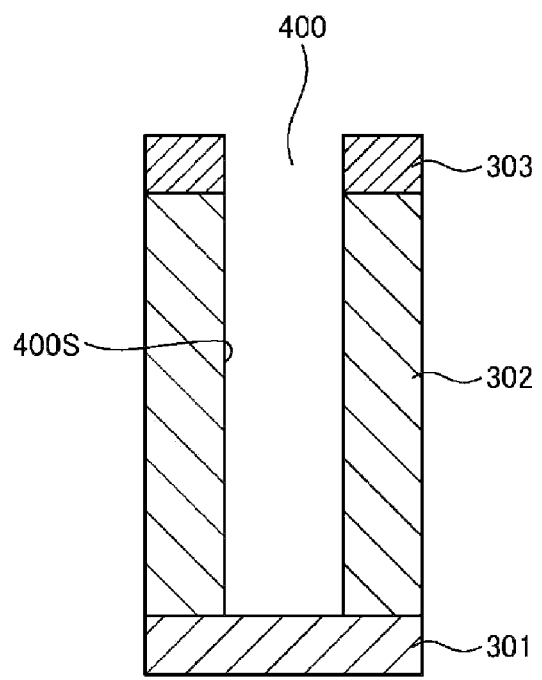
FIG. 5 is a view illustrating a case where the substrate illustrated in FIG. 2B is further etched by changing the frequency of the RF bias power from the first frequency to a second frequency.

FIG. 5 is a view illustrating a case where the substrate 300 illustrated in FIG. 2B is further etched by changing the frequency of the RF bias power from the first frequency to the second frequency. By etching the substrate 300 of FIG. 2B while changing the frequency of the RF bias power, the depth position at which the opening dimension is the largest may be moved downward. Thus, as illustrated in FIG. 5, the dimension (the width) of the bottom 400B of the recess 400 may be expanded, and the side wall 400S of the recess 400 may be formed substantially vertically. As a result, the shape of the recess 400 may be changed from the shape illustrated in FIG. 2B to the rectangular shape illustrated in FIG. 5.

In the first embodiment, the etching target film 302 may be etched continuously during the time period from the generation of plasma in step S102 until the underlying layer 301 is exposed. During this time period, plasma may be continuously generated from the processing gas, and the bias power may be continuously supplied to the stage. As described above, in the first embodiment, the shape abnormality such as the bowing may be suppressed by performing the etching while changing the frequency of the RF bias power. Thus, it is unnecessary to form a protective film on the side wall 400S of the recess 400 during the etching, so that the process may be performed with a high throughput.

Timing for Changing RF Bias Power

Figure 6:
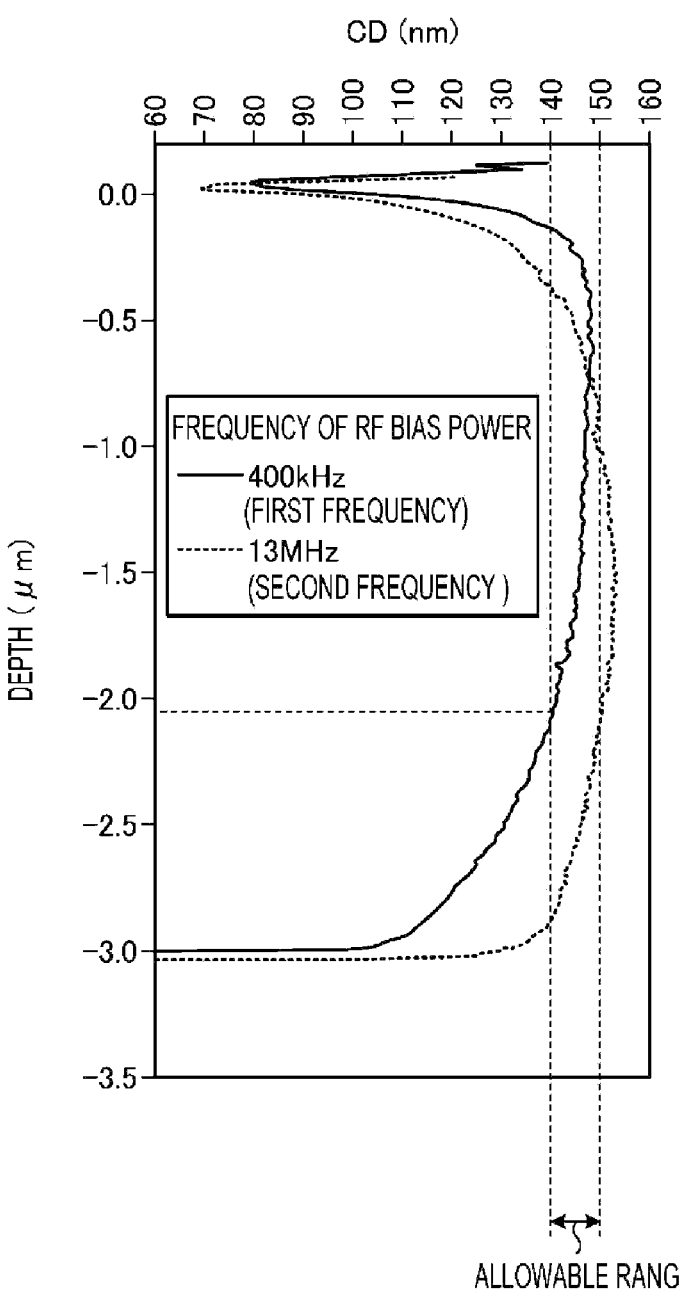
FIG. 6 is a view illustrating an example of a timing for changing the RF bias power.

FIG. 6 is a view illustrating an example of a timing for changing the RF bias power. FIG. 6 illustrates the relationship between the frequency of the RF bias power and the opening dimension (the CD) of the formed recess 400. Here, it is assumed that the first frequency is 400 kHz, and the second frequency is 13 MHz. Further, it is assumed that the CD of the recess 400 preferably falls within the allowable range of 140 nm to 150 nm.

As illustrated in FIG. 6, when the etching is progressed by supplying the bias power having the first frequency (400 kHz) to the stage (FIG. 1, step S103), the opening dimension (the CD) of the recess 400 gradually decreases as the depth increases. When the depth reaches about −2.0 μm, the CD of the recess 400 reaches 140 nm, which is the lower limit of the allowable range. In this case, the aspect ratio of the depth of about −2.0 μm is the "depth position aspect ratio" described above. Then, at a time point when the aspect ratio of the recess 400 being formed by the etching in step S103 reaches the "depth position aspect ratio" described above (the aspect ratio of the depth of about −2.0 μm), the frequency of the RF bias power is changed to the second frequency (13 MHz). Accordingly, at the depth position exceeding the "depth position aspect ratio" described above, the collision of ions against the side wall 400S of the recess 400 may be accelerated, and the depth position at which the CD is the largest may be moved further downward. That is, by increasing the dimension (the width) of the bottom 400B of the recess 400 at the depth position exceeding the "depth position aspect ratio" described above, the shape of the recess 400 may finally be made close to the rectangular shape.

Effect of First Embodiment

The etching method according to the first embodiment includes steps a), b), c), and d). In step a), a substrate having an underlying layer and an etching target film formed on the underlying layer is provided on a stage. In step b), plasma is generated from a processing gas. In step c), a bias power having a first frequency is supplied to the stage to etch the etching target film, thereby forming a recess. In step d), the frequency of the bias power (the RF bias power) is changed to a second frequency different from the first frequency according to the aspect ratio of the recess after step c), and the etching target film is further etched. In the etching method according to the first embodiment, the etching target film is etched continuously during the time period from the generation of plasma until the underlying layer is exposed. Thus, according to the first embodiment, the shape of the recess being formed by the etching may be controlled by changing the frequency of the RF bias power as the aspect ratio of the recess being formed by the etching increases. As a result, according to the first embodiment, it is possible to improve the shape abnormality of a pattern being formed on the substrate by the etching.

In the first embodiment, in step d), the shape of the recess that corresponds to the first frequency may be specified referring to the data indicating the shape of the recess formed when the etching target film is etched until reaching the underlying layer for each frequency of the bias power. Then, in step d), the second frequency may be selected based on the specified shape of the recess. Thus, in the first embodiment, the shape of the recess may be controlled by selecting the frequency of the bias power that may be adjusted according to the shape of the recess being formed by the etching. Therefore, according to the first embodiment, it is possible to further improve the shape abnormality of a pattern being formed on the substrate by the etching.

In the first embodiment, in step d), a frequency higher than the first frequency may be selected as the second frequency, when the specified shape of the recess is the tapered shape. Further, in step d), a frequency lower than the first frequency may be selected as the second frequency, when the specified shape of the recess is the bowing shape. According to the first embodiment, when the shape abnormality of a pattern occurs due to the etching, the shape of a recess may be controlled by selecting the frequency of the bias power to form the shape that offsets the shape abnormality. As a result, according to the first embodiment, it is possible to further improve the shape abnormality of a pattern being formed on the substrate by the etching.

In the first embodiment, step c) may be terminated, and step d) may be started, before the opening dimension of the recess that corresponds to the first frequency reaches the upper limit of the predetermined allowable range (at a time point when or before the opening dimension reaches the upper limit of the allowable range), based on the specified shape of the recess. Alternatively, step c) may be terminated, and step d) may be performed, before the opening dimension of the recess that corresponds to the first frequency reaches the lower limit of the predetermined allowable range (at a time point when or before the opening dimension reaches the lower limit of the allowable range), based on the specified shape of the recess. Thus, according to the first embodiment, the shape of the recess may be controlled by adjusting the frequency of the bias power such that the opening dimension of the recess being formed by the etching does not deviate from the allowable range. As a result, according to the first embodiment, it is possible to further improve the shape abnormality of a pattern being formed on the substrate by the etching.

In the first embodiment, based on the specified shape of the recess, the range of an aspect ratio of a depth position at which the opening dimension of the recess that corresponds to the first frequency reaches the upper limit or the lower limit of the predetermined allowable range. Then, step c) may be terminated within the specified range of the aspect ratio of the recess, and step d) may be performed. Thus, according to the first embodiment, the shape of the recess may be controlled by adjusting the frequency of the bias power such that the opening dimension of the recess formed by the etching does not deviate from the allowable range. As a result, according to the first embodiment, it is possible to further improve the shape abnormality of a pattern formed on the substrate by the etching.

In the first embodiment, the aspect ratio of the recess after step c) may be estimated using an elapsed time from the start of step c) or a plasma state. Thus, in the first embodiment, the first frequency may be changed to the second frequency according to the elapsed time from the start of step c) or the emission state of plasma described above.

In the first embodiment, a recess having an aspect ratio of 50 or more may be finally formed in the etching target film. Thus, according to the first embodiment, the shape abnormality of a pattern being formed may be improved, even when a pattern with a high aspect ratio is formed on the substrate by the etching.

Second Embodiment

In the first embodiment above, the shape of a recess being formed is controlled by changing the frequency of the RF bias power supplied to the stage only once. Without being limited thereto, the frequency of the RF bias power may be changed multiple times. In a second embodiment, descriptions will be made on an example where the frequency of the RF bias power is changed by stages to a plurality of different frequencies.

Figure 7:
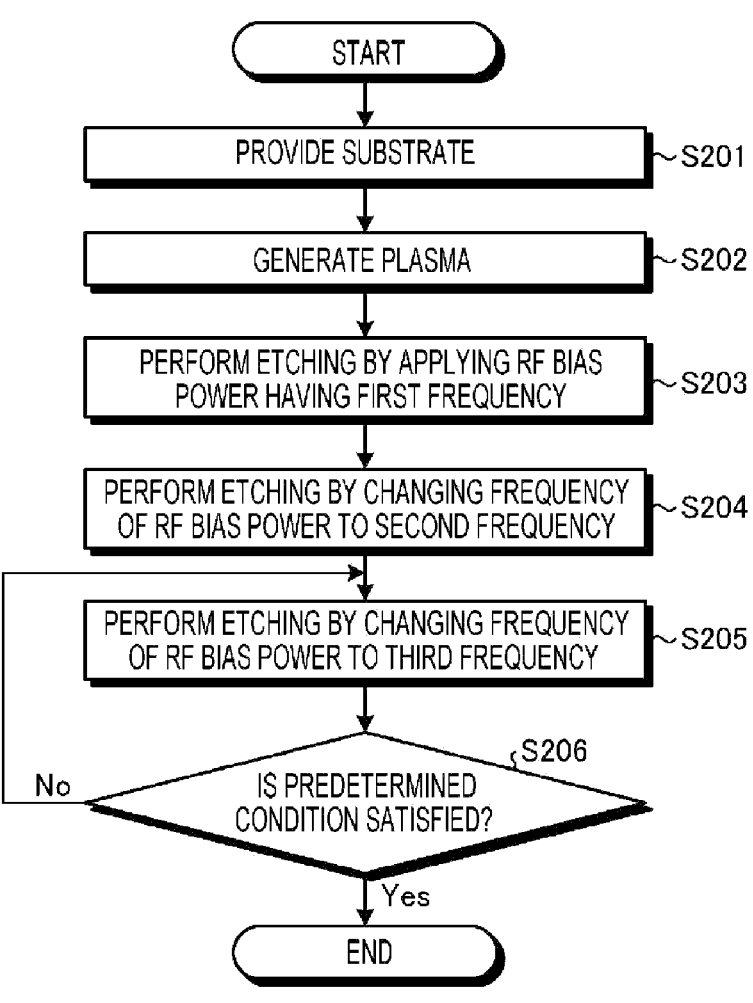
FIG. 7 is a flowchart illustrating an example of the flow of an etching method according to a second embodiment.

FIG. 7 is a flowchart illustrating an example of the flow of an etching method according to a second embodiment. First, a substrate is provided (step S201). For example, a substrate is provided, which has an underlying layer, an etching target film formed on the underlying layer, and a mask formed on the etching target film. The substrate is carried into a processing chamber in which a stage is disposed, and is disposed on the stage.

Next, plasma is generated from a processing gas in the processing chamber (step S202). Next, an RF bias power having a first frequency is supplied to the stage on which the substrate is disposed, to etch the etching target film (step S203). In step S203, ions in the plasma are attracted to the etching target film so that the etching target film is etched. As a result of the etching of the etching target film, a pattern including a recess is formed on the substrate.

Next, the etching target film is further etched by changing the frequency of the RF bias power to a second frequency different from the first frequency according to the aspect ratio of the recess being formed by the etching (step S204).

Next, the etching target film is further etched by changing the frequency of the RF bias power to a third frequency different from the second frequency according to the aspect ratio of the recess being formed by the etching (step S205).

Thereafter, it is determined whether the formed pattern, for example, the recess satisfies a predetermined condition (step S206). When it is determined that the predetermined condition is not satisfied (step S206, No), the process continues by returning to step S205. Meanwhile, when it is determined that the predetermined condition is satisfied (step S206, Yes), the process is terminated.

Example of Pattern Formed in Second Embodiment

A substrate 300 to which the etching method according to the second embodiment is applied is similar to the substrate 300 illustrated in FIG. 2A. In the etching method according to the second embodiment, first, the substrate 300 is disposed on the stage in step S201. Next, plasma is generated from a processing gas in step S202. Next, in step S203, the RF bias power having the first frequency is supplied to the stage to etch the etching target film 302. As the first frequency, for example, a frequency of 1 MHz to 13 MHz is used. Here, it is assumed that the first frequency is 13 MHz.

Figure 8:
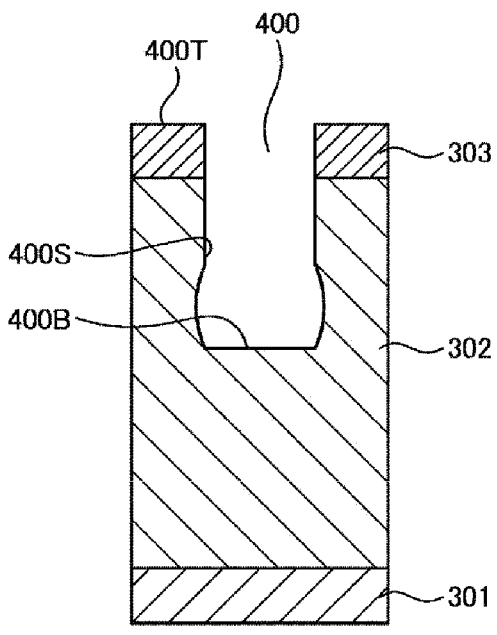
FIG. 8 is a view illustrating another example of the recess formed in the substrate illustrated in FIG. 2A.

By the etching in step S203, a recess 400 is formed in the etching target film 302 and the mask 303 on the underlying layer 301, as illustrated in FIG. 8. The recess 400 has a bottom 400B, a side wall 400S, and a top 400T. In the state of FIG. 8, the bottom surface of the recess 400 (the surface of the bottom 400B) is positioned inside the etching target film 302. FIG. 8 is a view illustrating another example of the recess being formed in the substrate 300 illustrated in FIG. 2A.

In FIG. 8, the opening dimension (the width) of the recess 400 increases at a position near the bottom 400B. It is considered that the change in the opening dimension of the recess 400 is caused by the magnitude (13 MHz) of the frequency (the first frequency) of the RF bias power supplied to the stage. That is, from the result of FIG. 3, it may be understood that as the frequency of the RF bias power is high, the depth position at which the opening dimension (the CD) is the largest moves downward, so that the shape of the recess 400 becomes close to the bowing shape.

Figure 9:
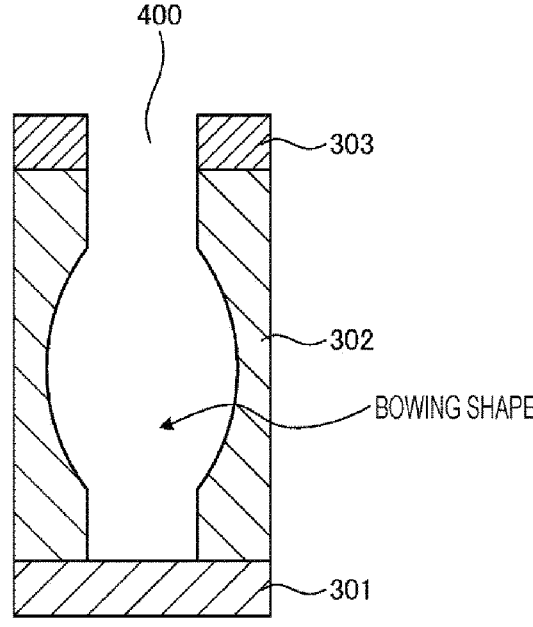
FIG. 9 is a view illustrating a case where the substrate illustrated in FIG. 8 is further etched in a state where the frequency of the RF bias power is maintained at the first frequency.

Here, it is assumed that the etching is progressed while maintaining the state of FIG. 8 (in other words, while maintaining the frequency of the RF bias power supplied to the stage at the first frequency (13 MHz)), and the bottom 400B of the recess 400 reaches the underlying layer 301. Then, the etching is progressed in the horizontal direction as the depth increases, and the inner peripheral surface of the recess 400 (the surface surrounded by the side wall 400S) expands in the horizontal direction. In this case, as illustrated in FIG. 9, the recess 400 has the bowing shape. FIG. 9 is a view illustrating a case where the substrate 300 illustrated in FIG. 8 is further etched in a state where the frequency of the RF bias power is maintained at the first frequency.

In the etching method according to the second embodiment illustrated in FIG. 7, the shape of the recess 400 being formed in the substrate 300 is controlled by changing the frequency of the RF bias power supplied to the stage. That is, in the etching method according to the second embodiment, the etching target film 302 is further etched by changing the frequency of the RF bias power to the second frequency different from the first frequency according to the aspect ratio of the recess 400 (FIG. 7, step S204).

Specifically, the changing of the frequency of the RF bias power in step S204 is performed as follows. First, the shape of the recess 400 that corresponds to the first frequency is specified referring to the shape data described above. The shape data is, for example, data that indicates the relationship illustrated in FIG. 3 between the frequency of the RF bias power and the opening dimension (the CD) of the formed recess 400 in the form of an arithmetic formula or a table. Then, when the shape of the recess 400 that corresponds to the first frequency is specified referring to the shape data, the second frequency is selected based on the specified shape of the recess 400. For example, when the specified shape of the recess 400 is the tapered shape, a frequency higher than the first frequency is selected as the second frequency. For example, when the specified shape of the recess 400 is the bowing shape, a frequency lower than the first frequency is selected as the second frequency. Here, referring to the shape data, the shape of the recess 400 that corresponds to the first frequency (13 MHz) is specified as the bowing shape, and a frequency lower than the first frequency is selected as the second frequency. The second frequency may be any frequency lower than the first frequency (13 MHz), and is selected from frequencies of, for example, 1 MHz or more and 1 MHz or less. Here, it is assumed that the second frequency is 400 kHz. Based on the specified shape of the recess 400, an aspect ratio is obtained for a depth position at which the opening dimension (the width) of the recess 400 reaches the upper limit of the predetermined allowable range (hereinafter, appropriately referred to as the "depth position aspect ratio"). Then, at a time point when the aspect ratio of the recess 400 after the etching in step S203 reaches the obtained depth position aspect ratio, the frequency of the RF bias power is changed to the selected second frequency (400 kHz). In other words, the process of step S203 is terminated, and the process of step S204 is performed, at a time point when the aspect ratio of the recess 400 after the etching in step S203 reaches the obtained depth position aspect ratio (an example of a time point when the opening dimension of the recess 400 is within the predetermined allowable range). In a case of suppressing the shape abnormality such as the bowing shape in which the inner peripheral surface of the recess 400 expands in the horizontal direction, the progress of the etching in the horizontal direction may be delayed by lowering the frequency of the RF bias power as the aspect ratio of the recess 400 increases.

Figure 10:
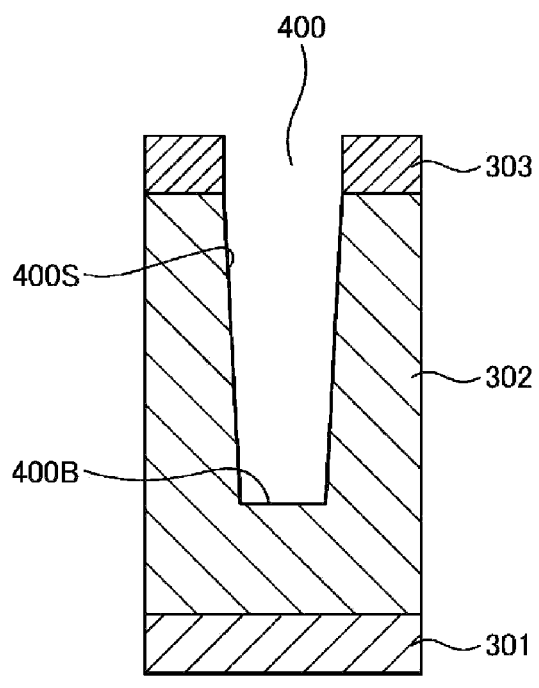
FIG. 10 is a view illustrating a case where the substrate illustrated in FIG. 8 is further etched by changing the frequency of the RF bias power from the first frequency to the second frequency.

FIG. 10 is a view illustrating a case where the substrate 300 illustrated in FIG. 8 is further etched by changing the frequency of the RF bias power from the first frequency to the second frequency. By etching the substrate 300 of FIG. 8 while changing the frequency of the RF bias power, the progress of the etching in the horizontal direction may be delayed. That is, in the second embodiment, a depth position at which the bowing occurs is specified referring to the data indicating the shape of the recess formed when the etching of FIG. 9 is performed, and the frequency of the RF bias power is changed from the first frequency to the second frequency at a position shallower than the depth position at which the bowing occurs. As a result, as illustrated in FIG. 10, the expansion of the inner peripheral surface of the recess 400 (the surface surrounded by the side wall 400S) in the horizontal direction may be suppressed.

In the state of FIG. 10, the recess 400 has the tapered shape that gradually tapers from the middle in the depth direction. When the etching is further progressed in the state of FIG. 10, it is difficult to form the sidewall 400S vertically. Thus, it may be difficult to form a pattern perpendicular to the depth direction.

In the etching method according to the second embodiment illustrated in FIG. 7, the shape of the recess 400 being formed in the substrate 300 is also controlled by further changing the frequency of the RF bias power supplied to the stage. That is, the etching target film 302 is further etched by changing the frequency of the RF bias power to the third frequency different from the previously used second frequency, according to the aspect ratio of the recess 400 (FIG. 7, step S205). The third frequency may be appropriately selected according to the shape of the recess 400 that corresponds to the second frequency. Here, since the shape of the recess 400 that corresponds to the second frequency (400 kHz) is the tapered shape, a frequency higher than the second frequency is selected as the third frequency. The third frequency is selected from, for example, frequencies of 5 MHz or more and 40 MHz or less. In a case of suppressing the shape abnormality such as the tapered shape in which the opening of the recess 400 narrows from top to bottom, a horizontal etching at a deep position may be accelerated by increasing the frequency of the RF bias power as the aspect ratio of the recess 400 increases. That is, the sidewall 400S near the bottom 400B of the recess 400 may be etched more.

Figure 11:
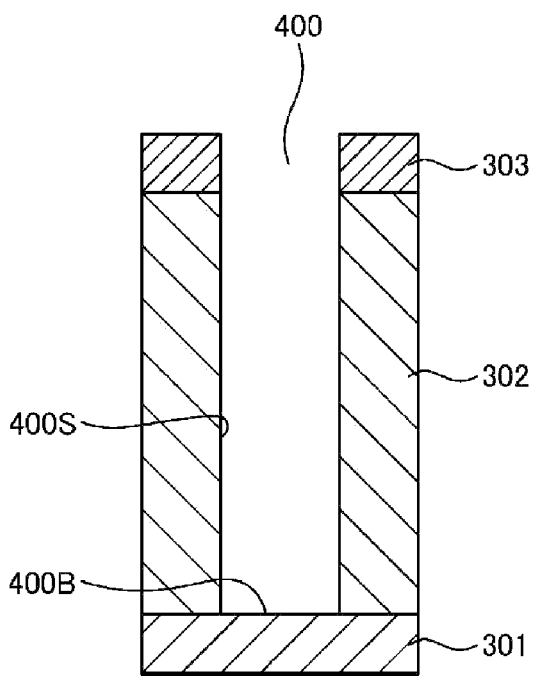
FIG. 11 is a view illustrating a case where the substrate illustrated in FIG. 10 is further etched by changing the frequency of the RF bias power from the second frequency to a third frequency.

FIG. 11 is a view illustrating a case where the substrate 300 illustrated in FIG. is further etched by changing the frequency of the RF bias power from the second frequency to the third frequency. By etching the substrate 300 of FIG. 10 while changing the frequency of the RF bias power to the third frequency, the horizontal etching at the deep position may be accelerated. Thus, as illustrated in FIG. 11, the dimension (the width) of the bottom 400B of the recess 400 may be expanded, and the side wall 400S of the recess 400 may be formed substantially vertically. As a result, the shape of the recess 400 may be changed from the shape illustrated in FIG. 10 to the rectangular shape illustrated in FIG. 11.

In the second embodiment as well, the etching target film 302 may be etched continuously during the time period from the generation of plasma in step S202 until the underlying layer 301 is exposed. During the time period, plasma may be continuously generated from the processing gas, and the bias power may be continuously supplied to the stage. As in the first embodiment described above, in the second embodiment as well, it is unnecessary to perform a step of forming a protective film on the side wall 400S of the recess 400 during the etching, so that the process may be performed with a high throughput.

Effect of Second Embodiment

In the method according to the second embodiment, after step d), a process may be performed at least once, which further etches the etching target film by changing the frequency of the bias power to a frequency different from the frequency used for the previous etching, according to the aspect ratio of the recess. Thus, according to the second embodiment, the shape of the recess being formed may be controlled by changing the frequency of the RF bias power to a plurality of different frequencies as the aspect ratio of the recess being formed by the etching increases. For example, in a stage where the aspect ratio of the recess being formed is low, the frequency of the RF bias power may be lowered to secure the etching rate. Then, as the aspect ratio of the recess increases, the frequency of the RF bias power may be increased to accelerate the horizontal etching at the deep position. As a result, according to the second embodiment, the shape abnormality of the pattern being formed may be suppressed.

Example of Configuration of Etching Apparatus According to Embodiment

Figure 12:
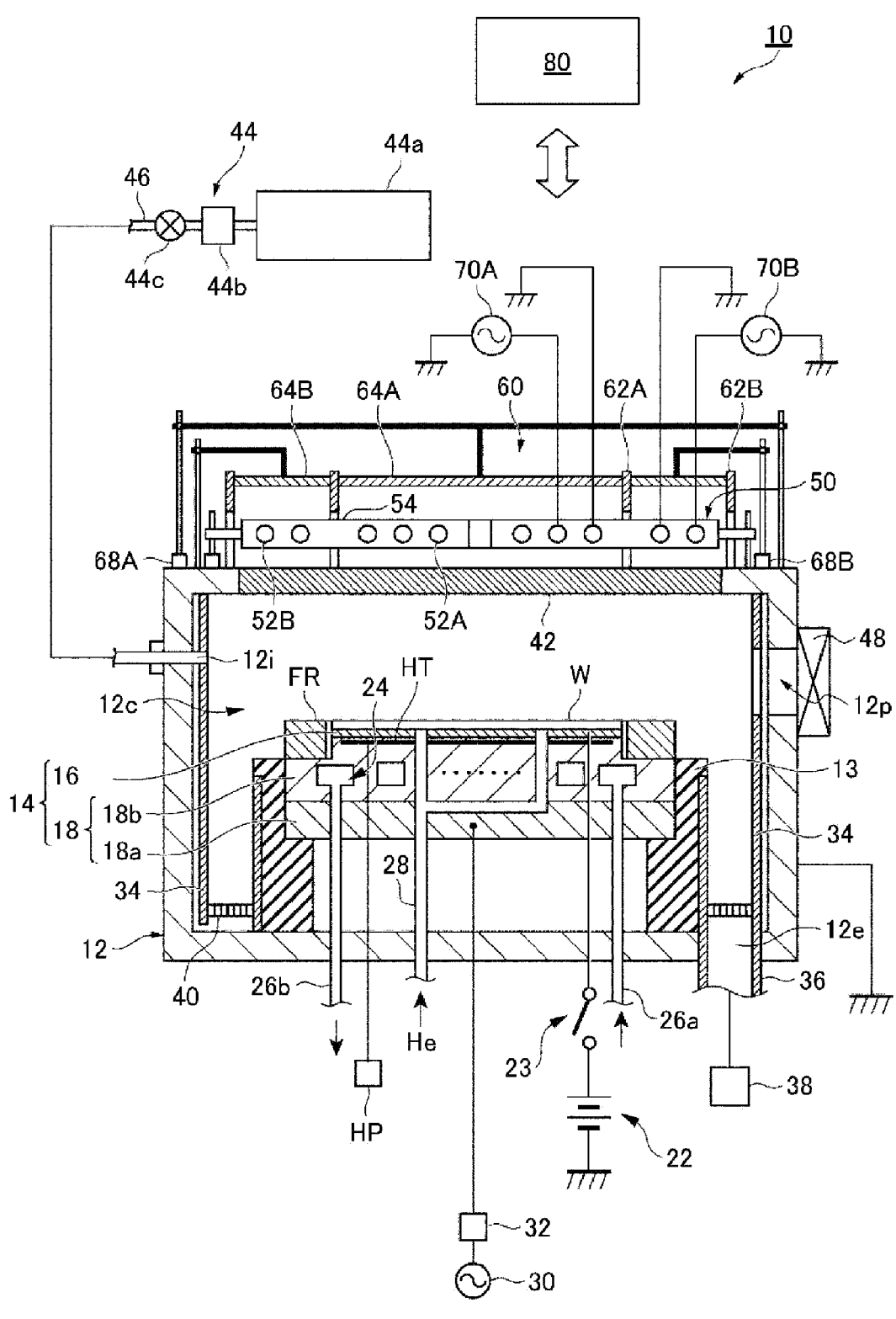
FIG. 12 is a view illustrating a schematic configuration of an etching apparatus according to an embodiment.

FIG. 12 is a view illustrating a schematic configuration of an etching apparatus 10 according to an embodiment. The etching apparatus 10 illustrated in FIG. 12 may be used to implement the etching method according to the embodiment. The etching apparatus 10 illustrated in FIG. 12 is a so-called inductively-coupled plasma (ICP) apparatus, and includes a plasma source for generating inductively-coupled plasma. The etching apparatus according to the embodiment may use plasma generated by other methods. For example, the etching apparatus according to the embodiment may use capacitively coupled plasma (CCP), electron-cyclotron-resonance (ECR) plasma, helicon wave excited plasma (HWP), or surface wave plasma (SWP).

The etching apparatus 10 includes a processing chamber 12. The processing chamber 12 is formed of a metal such as aluminum. The processing chamber 12 has, for example, a substantially cylindrical shape. A space 12c is formed in the processing chamber 12, so that a processing is performed in the space 12c.

A substrate support table (also referred to as a stage) 14 is disposed at a lower portion of the space 12c. The substrate support table 14 is configured to hold a substrate W disposed thereon. The substrate W is, for example, a substrate that is processed by the etching method of the embodiment.

The substrate support table 14 may be supported by a support mechanism 13. The support mechanism 13 extends upward from the bottom of the processing chamber 12 inside the space 12c. The support mechanism 13 may be substantially cylindrical. The support mechanism 13 may be made of an insulating material such as quartz.

The substrate support table 14 includes an electrostatic chuck 16 and a lower electrode 18. The lower electrode 18 includes a first plate 18a and a second plate 18b. The first plate 18a and the second plate 18b are made of metal such as aluminum. The first plate 18a and the second plate 18b are each substantially cylindrical. The second plate 18b is disposed on the first plate 18a. The second plate 18b is electrically connected to the first plate 18a.

The electrostatic chuck 16 is disposed on the second plate 18b. The electrostatic chuck 16 includes an insulating layer and a thin film electrode disposed inside the insulating layer. A DC power supply 22 is electrically connected to the thin film electrode of the electrostatic chuck 16 via a switch 23. The electrostatic chuck 16 generates an electrostatic force from a DC voltage of the DC power supply 22. The electrostatic chuck 16 attracts and holds the substrate W by the generated electrostatic force.

An edge ring FR is disposed on and around the second plate 18b to surround the outer peripheries of the substrate W and the electrostatic chuck 16, during the operation of the etching apparatus 10. The edge ring FR has a function of improving the uniformity of a process. The edge ring FR is made of, for example, silicon.

A flow path 24 is formed inside the second plate 18b. A heat exchange medium such as a coolant for a temperature control is supplied to the flow path 24 from a temperature adjustment unit (e.g., a chiller unit) disposed outside the processing chamber 12. The temperature adjustment unit adjusts the temperature of the heat exchange medium. The heat exchange medium is supplied from the temperature adjustment unit to the flow path 24 through a pipe 26a. The heat exchange medium supplied from the temperature adjustment unit to the flow path 24 through the pipe 26a is, then, returned to the temperature adjustment unit through a pipe 26b. After the temperature control by the temperature adjustment unit, the heat exchange medium is returned to the flow path 24 inside the substrate support table 14. In this manner, the temperature of the substrate support table 14, that is, the temperature of the substrate W may be adjusted.

The etching apparatus 10 further includes a gas supply line 28 that extends to the upper surface of the electrostatic chuck 16 through the inside of the substrate support table 14. A heat exchange gas such as helium (He) gas is supplied into the space between the upper surface of the electrostatic chuck 16 and the lower surface of the substrate W, from a heat exchange gas supply mechanism through the gas supply line 28. Thus, the heat exchange between the substrate support table 14 and the substrate W is accelerated.

A heater HT may be disposed inside the substrate support table 14. The heater HT is a heating device. The heater HT is embedded, for example, in the second plate 18b or the electrostatic chuck 16. The heater HT is connected to a heater power supply HP. When the heater power supply HP supplies a power to the heater HT, the temperature of the substrate support table 14, and furthermore, the temperature of the substrate W are adjusted.

A radio-frequency (RF) power supply 30 is connected to the lower electrode 18 of the substrate support table 14 via a matching device 32. The RF power supply 30 generates an RF bias power, and supplies the RF bias power to the lower electrode 18 to attract ions to the substrate W disposed on the substrate support table 14. The RF power supply 30 may change the frequency of the RF bias power within the range of, for example, 400 kHz to 40.68 MHz. The RF power supply 30 is an example of a bias power supply. The RF power supply 30 may include a plurality of RF power supplies that generate RF bias powers having different frequencies. In this case, the frequency of the RF bias power supplied to the lower electrode 18 may be changed by a switch provided on the downstream side of the plurality of RF power supplies.

Instead of the RF power supply 30, a voltage pulse power supply may be used, and may be configured to supply a voltage pulse other than the RF power. Here, the voltage pulse is a pulse-like voltage of which voltage magnitude changes periodically. The voltage pulse power supply is configured to change the frequency of the voltage pulse. The voltage pulse power supply may be a DC power supply. The voltage pulse power supply may be configured to directly supply the voltage pulse, or may be configured to include a device for pulsing the voltage on the downstream side of the power supply. In an embodiment, the voltage pulse is applied to the lower electrode 18 such that the substrate W has a negative potential. The voltage pulse may be a square wave, a triangular wave, or an impulse, or may have other waveforms. The voltage pulse power supply may change the frequency of the voltage pulse (a pulse frequency) within the range of, for example, 100 kHz to 2 MHz. The voltage pulse power supply may include a plurality of voltage pulse power supplies that generate voltage pulses having different frequencies. In this case, similarly to the RF power supply described above, the frequency of the voltage pulse supplied to the lower electrode 18 may be changed by a switch provided on the downstream side of the plurality of voltage pulse power supplies.

The RF bias power or the voltage pulse may be supplied to a bias electrode separately provided inside the electrostatic chuck 16, instead of the lower electrode 18.

The etching apparatus 10 further includes a shield 34 removably attached to the inner wall of the processing chamber 12. The shield 34 is also disposed to surround the outer periphery of the support mechanism 13. The shield 34 suppresses by-products produced by a processing from adhering to the processing chamber 12. The shield 34 may be an aluminum member coated with ceramics such as $Y_2O_3$.

An exhaust path is formed between the substrate support table 14 and the side wall of the processing chamber 12. The exhaust path is connected to an exhaust port 12e formed at the bottom of the processing chamber 12. The exhaust port 12e is connected to an exhaust device 38 via a pipe 36. The exhaust device 38 includes a pressure regulator and a vacuum pump such as a turbo molecular pump (TMP). A baffle plate 40 is disposed in the exhaust path, that is, between the substrate support table 14 and the side wall of the processing chamber 12. The baffle plate 40 has a plurality of through holes penetrating through the baffle plate 40 in the thickness direction thereof. The baffle plate 40 may be an aluminum member of which surface is coated with ceramics such as $Y_2O_3$.

An opening is formed in the upper side of the processing chamber 12. The opening is closed by a window 42. The window 42 is formed of a dielectric such as quartz. The window 42 is, for example, a flat plate.

An gas intake port 12i is formed in the side wall of the processing chamber 12. The gas intake port 12i is connected to a gas supply unit 44 via a pipe 46. The gas supply unit 44 supplies various gases used for a processing into the space 12c. The gas supply unit 44 includes a plurality of gas sources 44a, a plurality of flow controllers 44b, and a plurality of valves 44c. Although not explicitly illustrated in FIG. 12, a plurality of different gas intake ports may be provided for gases to be supplied, respectively, so that the gases do not mix with each other.

The plurality of gas sources 44a include gas sources of various gases to be described later. One gas source may supply one or more gases. The plurality of flow controllers 44b may be each a mass flow controller (MFC), and implement a flow control through a pressure control. Each gas source included in the plurality of gas sources 44a is connected to the gas intake port 12i via one corresponding flow controller among the plurality of flow controllers 44b and one corresponding valve among the plurality of valves 44c. The position of the gas intake port 12i is not particularly limited. For example, the gas intake port 12i may be formed in the window 42, rather than in the side wall of the processing chamber 12.

An opening 12p is formed in the side wall of the processing chamber 12. The opening 12p serves as a carry-in/out passage for the substrate W, through which the substrate W is carried into the space 12c of the processing chamber 12 from the outside, and carried out from the inside of the space 12c to the outside of the processing chamber 12. A gate valve 48 is provided on the side wall of the processing chamber 12, to open and close the opening 12p.

An antenna 50 and a shield 60 for shielding the antenna 50 are disposed on the processing chamber 12 and the window 42. The antenna 50 and the shield 60 are arranged above the window 42 on the outer side of the processing chamber 12. In an embodiment, the antenna 50 includes an inner antenna element 52A and an outer antenna element 52B. The inner antenna element 52A is a spiral coil disposed in the center of the window 42. The outer antenna element 52B is a spiral coil disposed above the window 42 on the outer peripheral side of the inner antenna element 52A. The inner antenna element 52A and the outer antenna element 52B are each made of a conductive material such as copper, aluminum, or stainless steel.

The inner antenna element 52A and the outer antenna element 52B are connected to RF power supplies 70A and 70B, respectively. The inner antenna element 52A and the outer antenna element 52B are supplied with a power of the same frequency or powers of different frequencies from the RF power supplies 70A and 70B, respectively. When an RF power is supplied from the RF power supply 70A or 70B to the antenna 50, an induced magnetic field is generated in the space 12c, and a processing gas in the space 12c is excited to generate plasma above the substrate W.

The etching apparatus 10 further includes a controller 80. The controller 80 may be a computing device provided with, for example, a processor, a storage unit such as a memory, an input unit, and a display. The controller 80 operates based on control programs or recipe data stored in the storage unit, and controls each component of the etching apparatus 10. For example, the controller 80 controls, for example, the plurality of flow controllers 44b, the plurality of valves 44c, the exhaust device 38, the RF power supplies 70A and 70B, the RF power supply 30, the matching device 32, and the heater power supply HP. When the etching method according to the embodiment is implemented, the controller 80 may control each component of the etching apparatus based on the control programs or the recipe data.

In all aspects, the embodiments disclosed herein are merely examples, and should not be construed as being limited. As for the foregoing embodiments, omission, substitution, or modification may be made in various ways without departing from the scope and spirit of the claims herein below.

For example, in the methods according to the first and second embodiments above, after step d), an etching shape may be monitored, and the first and second frequencies may be adjusted. The etching shape refers to, for example, all shapes formed on a substrate, and indicates, for example, the width of a recess. A monitor device for monitoring the etching shape may be provided, for example, inside the etching apparatus or at an arbitrary location in a processing system including the etching apparatus. In an embodiment, the monitor device is provided in the opening 12*p* of the etching apparatus 10 illustrated in FIG. 12. As the monitor device, for example, an optical observation device, a weighing machine, or an ultrasonic microscope may be used.

LIST OF REFERENCE NUMERALS

10 . . . etching apparatus
12 . . . processing chamber
12*c* . . . space
12*e* . . . exhaust port
12*i* . . . gas intake port
12*p* . . . opening
13 . . . support mechanism
14 . . . substrate support table
16 . . . electrostatic chuck
18 . . . lower electrode
18*a* . . . first plate
18*b* . . . second plate
22 . . . DC power supply
23 . . . switch
24 . . . flow path
26*a*, 26*b* . . . pipe
28 . . . gas supply line
30 . . . RF power supply
32 . . . matching device
34 . . . shield
36 . . . pipe
38 . . . exhaust device
40 . . . baffle plate
42 . . . window
44 . . . gas supply unit
44*a* . . . gas source
44*b* . . . flow controller
44*c* . . . valve
46 . . . pipe
48 . . . gate valve
50 . . . antenna
52A . . . inner antenna element
52B . . . outer antenna element
60 . . . shield
70B . . . RF power supply
80 . . . controller
W . . . substrate

What is claimed is:

1. An etching method comprising:
a) providing a substrate on a stage, the substrate having an underlying layer and an etching target film on the underlying layer;
b) generating plasma from a processing gas;
c) supplying a bias power having a first frequency to the stage to etch the etching target film, thereby forming a recess; and
d) changing a frequency of the bias power to a second frequency different from the first frequency according to an aspect ratio of the recess after c), to further etch the etching target film,
wherein after a generation of the plasma, the etching target film is continuously etched during a time period until the underlying layer is exposed, and
wherein the second frequency is selected based on a shape of the recess that corresponds to the first frequency, the shape of the recess being specified referring to data indicating the shape of the recess formed when the etching target film is etched until the underlying layer is exposed, for each frequency of the bias power.

2. The etching method according to claim 1, wherein after the generation of the plasma, the plasma is continuously generated from the processing gas during the time period until the underlying layer is exposed.

3. The etching method according to claim 1, wherein after the generation of the plasma, the bias power is continuously supplied to the stage during the time period until the underlying layer is exposed.

4. The etching method according to claim 1, wherein when the shape of the recess specified from the data is a tapered shape, a frequency higher than the first frequency is selected as the second frequency.

5. The etching method according to claim 1, wherein when the shape of the recess specified from the data is a bowing shape, a frequency lower than the first frequency is selected as the second frequency.

6. The etching method according to claim 1, wherein referring to the shape of the recess specified by the data, c) is terminated and d) is performed, before a maximum value of an opening dimension of the recess reaches an upper limit of an allowable range or before a minimum value of the opening dimension of the recess reaches a lower limit of the allowable range.

7. The etching method according to claim 1, wherein referring to the shape of the recess specified by the data, an aspect ratio range in which an opening dimension of the recess falls within an allowable range is specified, and within the specified aspect ratio range, c) is terminated and d) is performed.

8. The etching method according to claim 1, wherein the aspect ratio of the recess is estimated using an elapsed time from a start of c) or a state of the plasma.

9. The etching method according to claim 1, wherein after d), a process is performed at least once, which further etches the etching target film by changing the frequency of the bias power to a frequency different from a frequency used for a previous etching of the etching target film according to the aspect ratio of the recess.

10. The etching method according to claim 1, wherein the recess having the aspect ratio of 50 or more is finally formed in the etching target film.

11. The etching method according to claim 1, further comprising:
after d), monitoring an etching shape, and adjusting the first frequency and/or the second frequency.

12. The etching method according to claim 1, wherein the bias power is an RF bias power.

13. The etching method according to claim 12, wherein the bias power is a voltage pulse of which voltage magnitude changes periodically, and the bias power is supplied to the stage to generate a negative potential on the substrate.

14. An etching method comprising:

a) providing a substrate having an underlying layer and an etching target film on the underlying layer, on a stage;

b) generating plasma from a processing gas;

c) supplying an RF bias power having a first frequency to the stage to etch the etching target film, thereby forming a recess; and d) changing a frequency of the RF bias power to a second frequency higher than the first frequency after a predetermined time elapses from a start of c), to further etch the etching target film, wherein after a generation of the plasma, the etching target film is continuously etched during a time period until the underlying layer is exposed, the first frequency is 0.1 MHz or more and 1 MHz or less, the second frequency is 1 MHz or more and 13 MHz or less, and the recess formed in the etching target film finally has an aspect ratio of 50 or more, and wherein the second frequency is selected based on a shape of the recess that corresponds to the first frequency, the shape of the recess being specified referring to data indicating the shape of the recess formed when the etching target film is etched until the underlying layer is exposed, for each frequency of the bias power.

15. An etching method comprising:

a) providing a substrate on a stage, the substrate having an underlying layer and an etching target film on the underlying layer;

b) generating plasma from a processing gas;

c) supplying a bias power having a first frequency to the stage to etch the etching target film, thereby forming a recess; and d) changing a frequency of the bias power to a second frequency different from the first frequency according to an aspect ratio of the recess after c), to further etch the etching target film, wherein after a generation of the plasma, the etching target film is continuously etched during a time period until the underlying layer is exposed, wherein the bias power is an RF bias power, wherein the bias power is a voltage pulse of which voltage magnitude changes periodically, and the bias power is supplied to the stage to generate a negative potential on the substrate.

* * * * *